United States Patent
Leinsle et al.

(10) Patent No.: US 11,283,433 B2
(45) Date of Patent: Mar. 22, 2022

(54) METHOD FOR THE PWM ACTUATION OF HV COMPONENTS

(71) Applicant: WEBASTO SE, Stockdorf (DE)

(72) Inventors: Paul Leinsle, Stockdorf (DE); Jürgen Scherschmidt, Stockdorf (DE); Markus Prepens, Stockdorf (DE)

(73) Assignee: WEBASTO SE, Stockdorf (DE)

( * ) Notice: Subject to any disclaimer, the term of this patent is extended or adjusted under 35 U.S.C. 154(b) by 0 days.

(21) Appl. No.: 17/097,888

(22) Filed: Nov. 13, 2020

(65) Prior Publication Data

US 2021/0288642 A1 Sep. 16, 2021

(30) Foreign Application Priority Data

Oct. 15, 2019 (DE) .................... 10 2019 127 709.4

(51) Int. Cl.
| | |
|---|---|
| *H03K 5/04* | (2006.01) |
| *B60L 53/20* | (2019.01) |
| *B60L 1/08* | (2006.01) |
| *H02M 1/08* | (2006.01) |
| *H03K 17/567* | (2006.01) |

(52) U.S. Cl.
CPC ................. *H03K 5/04* (2013.01); *B60L 1/08* (2013.01); *B60L 53/20* (2019.02); *H02M 1/08* (2013.01); *H03K 17/567* (2013.01)

(58) Field of Classification Search
CPC .............. B60L 1/08; H02M 1/08; H03K 5/04
USPC .................................. 327/108, 109, 172, 175
See application file for complete search history.

(56) References Cited

U.S. PATENT DOCUMENTS

| | | | | |
|---|---|---|---|---|
| 4,825,144 | A * | 4/1989 | Alberkrack | H02M 3/28 323/272 |
| 5,901,054 | A * | 5/1999 | Leu | H02M 3/285 363/41 |
| 2006/0164366 | A1* | 7/2006 | Yu | G09G 5/18 345/98 |
| 2008/0238337 | A1* | 10/2008 | Masood | H05B 45/37 315/294 |

FOREIGN PATENT DOCUMENTS

| | | |
|---|---|---|
| DE | 102010049800 A1 | 1/2012 |
| JP | 2012085038 A | 4/2012 |
| JP | 2014078798 A | 5/2014 |
| WO | 2005056342 A1 | 6/2005 |

OTHER PUBLICATIONS

German Patent and Trademark Office, Examination Report, Application No. 102019127709.4, dated May 7, 2020, 6 pages.

* cited by examiner

*Primary Examiner* — William Hernandez
(74) *Attorney, Agent, or Firm* — Quarles & Brady LLP

(57) ABSTRACT

A method for the PWM actuation of more than one HV component for converting the power required by the HV components, in which each HV component is actuated by means of an individual PWM control circuit, and to a device for carrying out the method, wherein individual PWM control circuits are provided for the PWM actuation of 2 . . . n HV components, and wherein means are provided for asymmetrically splitting the phase shifts of the individual PWM actuation provided by the PWM circuitry.

9 Claims, 2 Drawing Sheets

METHOD FOR THE PWM ACTUATION OF HV COMPONENTS

CROSS-REFERENCE TO RELATED APPLICATIONS

This application claims priority to German Patent Application DE 10 2019 127 709.4 filed on Oct. 15, 2019, which is hereby incorporated by reference in its entirety for all purposes.

The disclosure relates to a method for the PWM actuation of HV components for converting the power required by the superordinate system.

HV components, e.g. load resistors of electric vehicles, must be fully functional over a relatively wide voltage range, which is between 250 V and 450 V for a 400-V on-board power supply.

To ensure this proper functioning, load resistors (e.g. load resistors in the form of heating elements) are configured so as to convert the necessary power at 250 V. At higher voltages and in the event of maximum actuation, a significantly higher (squared) power ($P=U^2/R$) would be converted in these load resistors, and this would destroy the load resistor due to thermal overloading. That power must be reduced to the maximum value by a controller. In addition, the power in the resistors must be reduced (controlled) below the maximum value as required.

Therefore, HV components or load resistors are mostly controlled by a PWM actuation (preferably by repeated, in particular constant switching on and off at an appropriate duty factor and a switching frequency of $f_{switch} \approx$ 400 Hz-20 kHz). Both the maximum and the required power can thereby be adjusted. Doing so, however, results in disturbances to the on-board power supply, such as line-related or field-related disturbances and current ripple. One way to reduce current ripple is to separate the HV components or load resistors into a plurality (1 . . . n) of smaller load resistors having a higher resistance and phase-shifted actuation ($\Delta I_{switch} = \Delta I_{system}/n$; $f_{system} = n \cdot f_{switch}$).

Separating the HV components or load resistors in this manner leads to line-related and field-related disturbances not only for $f_{switch}$, but also for $f_{system}$ and their common dividers. This effect occurs particularly markedly at reciprocal duty factors (for n=8→⅛, ¼, ⅜, ½, ⅝, ¾ ⅞, 1). For example, in the case of $f_{switch}$=500 Hz; n=8; $\Delta \phi_{1 \ldots n}$=45°, overshoots occur at 500 Hz, 1 kHz, 2 kHz, 4 kHz (=$f_{system}$).

There is therefore a need for a method for the PWM actuation of HV components for converting the power required by the HV components that ensures that the line-related and field-related disturbances that occur are reduced.

The object of the present disclosure is to provide a method for the PWM actuation of HV components for converting the power required by the HV components in which line-related and field-related disturbances are reduced.

This object is achieved by the features of claim 1. The dependent claims set out advantageous developments of the disclosure.

The disclosure thus provides a method for the PWM actuation of more than one HV component for converting the power required by the HV components in which each HV component is actuated by means of an individual PWM control circuit.

By actuating each HV component by means of its own PWM control circuit, line-related and field-related disturbances are reduced compared with the state of the art.

Advantageously, an odd number of HV components is used. In this respect, the use of three to nine HV components is preferred.

Particularly preferably, the HV components are block heaters, in particular in motor vehicles such as electric cars and/or hybrid electric vehicles.

In accordance with a particularly advantageous development of the disclosure, the individual PWM control circuits are actuated in a manner phase-shifted with respect to one another: in the process, the phase shifts are particularly preferably split asymmetrically. Asymmetric splitting means that the phase shift is not the same, but rather it varies. If there are four circuits, said circuits are then not each connected at a 90° shift, but rather at shifts of 89°, 92°, etc, for example. The phase shift, i.e. the deviation from the symmetrical phase shift of 90°, between these two circuits is then, for example −1° or +2°, i.e. the phase shift is between 1° and 2° in terms of magnitude.

This greatly reduces the line-related and field-related disturbances in the range of the system frequency $f_{system}$ or distributes them over a larger frequency range. The maximum phase shift is preferably 0.5 to 10°, in particular 1 to 6°, in terms of magnitude.

Advantageously, the HV components comprise at least one or more of the following elements: a heating core, a PTC heating core, a ceramic heating core or an electrical resistance heating core.

The disclosure also provides a device for carrying out the method according to the disclosure as explained above, wherein individual PWM control circuits are provided for the PWM actuation of 1 . . . n HV components, and wherein means are provided for asymmetrically splitting the phase shifts of the individual PWM actuation provided by the PWM circuitry.

The disclosure also provides a device for carrying out the method according to the disclosure, wherein one PWM control circuit is provided for the PWM actuation of more than one HV component, and wherein means are provided for asymmetrically splitting the phase shifts over the HV components or load resistors in the event of the PWM actuation provided by the PWM circuitry.

Preferably, the PWM control circuit for the PWM actuation of the HV components is configured by means of the odd number of HV components or load resistors. By using an odd number (if possible a prime number) of HV components or load resistors, the overshoots in the common dividers of $f_{switch}$ and $f_{system}$ can be eliminated.

In a simple manner in terms of circuitry, the individual PWM control circuits for the PWM actuation of the 0 . . . n HV components comprise means for the asymmetric PWM actuation the following elements:

a common oscillator unit for providing a uniform base signal ($f_{PWM\ base}$) for all the individual PWM control circuits, and 0 . . . n duty cycle units, and wherein the means for the asymmetric PWM actuation comprise the following elements:

0 . . . n phase-shifter units.

Advantageously, 1 . . . n load switches, in particular IGBTs, are provided for the individual PWM actuation of the 1 . . . n HV components.

The disclosure also achieves the following advantages:
The actuation concept according to the disclosure is very simple to implement.
The measures required for attenuating line-related and field-related disturbances can be considerably reduced.

Expensive components can consequently be omitted or made significantly smaller compared with the state of the art.

The disclosure will be explained in more detail below with reference to the drawings, in which.

Figure 1:
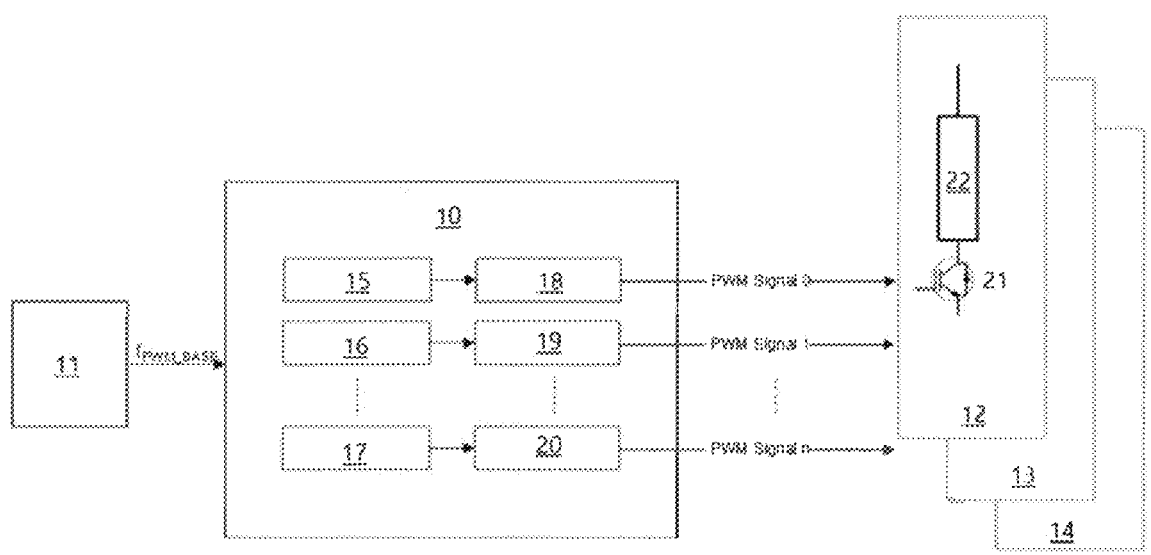
FIG. 1 is a block diagram of an embodiment of the device according to the disclosure for the PWM actuation of HV components.

FIG. 1 shows, in the form of a block diagram, an embodiment of the device according to the disclosure for the PWM actuation of HV components, in this case in the form of load resistors. The device comprises a PWM control circuit block 10, an oscillator unit 11 and HV components in the form of heating cores 12 to 14.

The PWM control circuit block 10 comprises 0 . . . n duty cycle units 15 to 17, and 0 . . . n phase-shifter units 18 to 20 downstream thereof. The same base signal ($f_{PWM\ base}$) is applied to both the duty cycle units and the phase-shifter units, said base signal being provided by the oscillator unit 11.

At the output of the phase-shifter unit 18, a PWM signal 0 is provided. At the output of the phase-shifter unit 19, a PWM signal 1 is provided, and at the output of the phase-shifter unit 20, a PWM signal n is provided. Relative to one another, these PWM signals have deviations from the symmetrical phase shift, which are generated by the phase-shifter units and are 0.5° to 10°, in particular 1° to 6°, in terms of magnitude.

Each PWM signal is used to actuate the load resistors individually in order to convert the power required by the HV components. Specifically, the load resistor in the load path 12 is actuated by the PWM signal 0, the load resistor in the load path 13 is actuated by the PWM signal 1, and the load resistor in the load path 14 is actuated by the PWM signal n. Each load resistor is fed its individual PWM signal via an individual load switch, in this case via an IGBT. Thus, the load resistor 22 is fed its PWM signal 0 via the IGBT 21. In the same way, the load resistor in the load path 12 is fed its PWM signal 1 via an IGBT, not shown, while the load resistor in the load path 13 is fed its PWM signal n via an IGBT, not shown.

Figure 2:
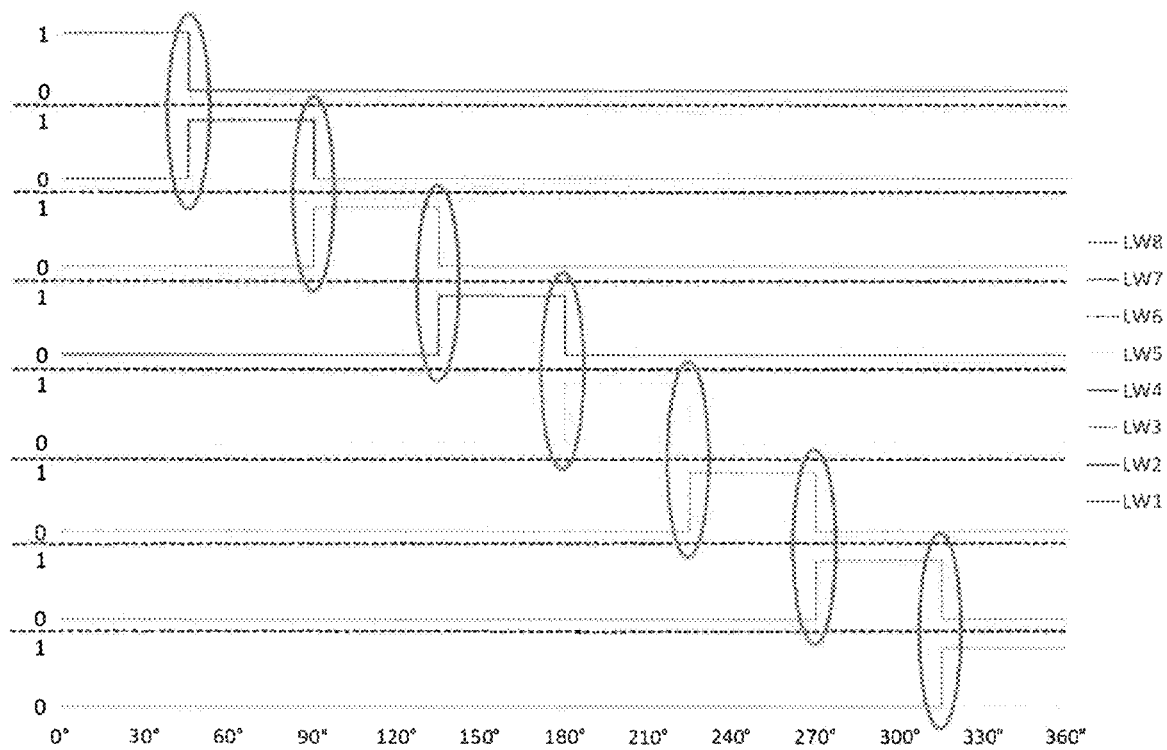
FIG. 2 is a graph showing a PWM actuation of eight HV components having a symmetrical phase shift.
Figure 3:
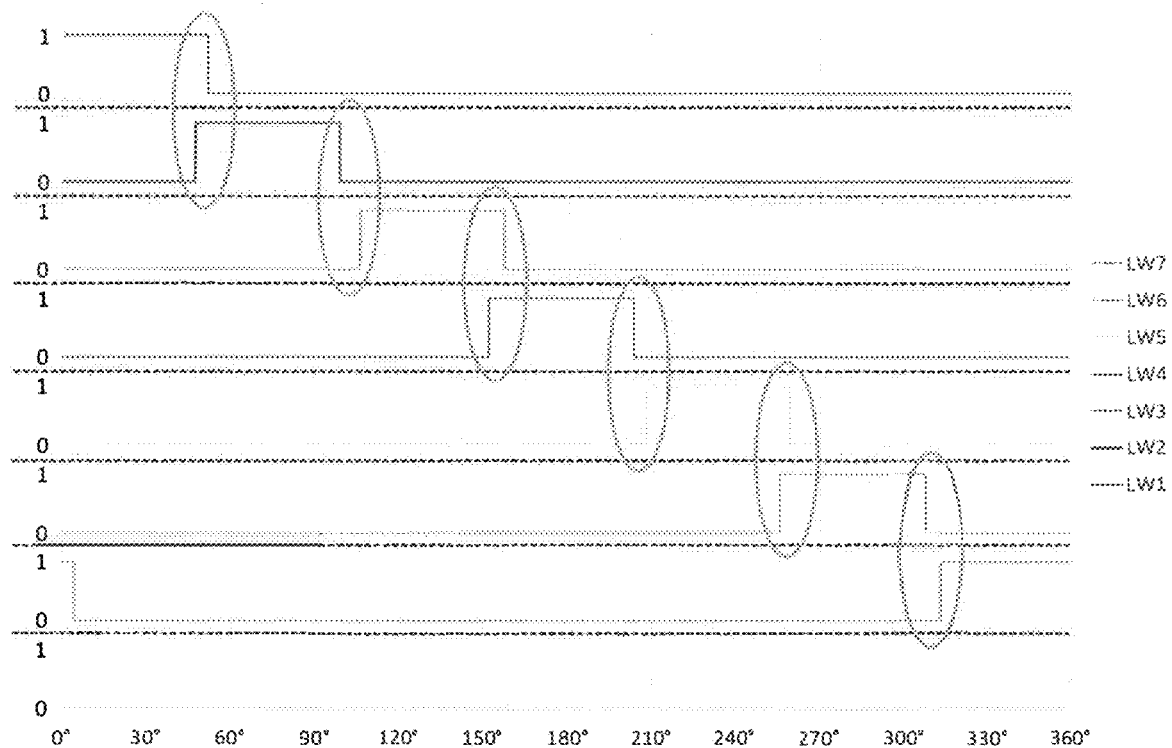
FIG. 3 is a graph showing a PWM actuation of seven HV components having an asymmetrical phase shift.

In the graphs in FIG. 2 and FIG. 3, the curve over time of the PWM signals for actuating eight or seven load resistors, respectively, or for converting the power required by the load resistors is plotted on the x-axis, and their amplitude is plotted on the y-axis.

In FIG. 2, the phase shift is split symmetrically while in FIG. 3 the phase shift is split asymmetrically in accordance with the proposal according to the disclosure for the PWM actuation of HV components for converting the power required by the HV component. In addition, it can be seen in FIGS. 2 and 3 that an even number of HV components or load resistors is used in FIG. 2 and an odd number thereof is used in FIG. 3.

Due to the measure of asymmetrically splitting the phase shifts, as reflected in FIG. 3, line-related and field-related disturbances in the range of the system frequency $f_{system}$ can be reduced or distributed over a larger frequency band or duty factor range. Due to the odd number of load resistors also visible in FIG. 2, the overshoots can be remedied by eliminating the common dividers of $f_{switch}$ and $f_{system}$.

The invention claimed is:

1. A method for the pulse width modulation (PWM) actuation of more than one high voltage (HV) component for converting the power required by the HV components, in which each HV component is actuated by means of an individual PWM control circuit, in which the individual PWM control circuits are actuated in a phase-shifted manner with respect to one another, and in which the phase shifts are split asymmetrically.

2. A method according to claim 1, in which an odd number of HV components is used.

3. A method according to claim 2, in which the HV components include at least one or more of the following elements: a heating core, a PTC heating core, a ceramic heating core or a resistance heating core.

4. A method according to claim 1, in which the HV components include at least one or more of the following elements: a heating core, a PTC heating core, a ceramic heating core or a resistance heating core.

5. A device for carrying out the method according to claim 1, wherein individual PWM control circuits are provided for the PWM actuation of at least two HV components, and wherein means are provided for asymmetrically splitting the phase shifts of the individual PWM actuation provided by the individual PWM control circuits.

6. A device according to claim 5, wherein the individual PWM control circuits for the PWM actuation of the at least two HV components comprise means for the asymmetric PWM actuation of the following elements:
   a common oscillator unit for providing a uniform base signal (fPWM base) for all the individual PWM control circuits, and
   at least two duty cycle units corresponding to the at least two HV components, respectively,
   and wherein the means for the asymmetric PWM actuation comprise the following elements:
   at least two phase-shifter units corresponding to the at least two HV components.

7. A device according to claim 6, wherein at least two load switches are provided for the individual PWM actuation of the corresponding at least two HV components.

8. A device according to claim 5, wherein at least two load switches, are provided for the individual PWM actuation of the corresponding at least two HV components.

9. A device according to claim 8, wherein the at least two load switches are IGBTs.

* * * * *